US 6,682,642 B2

(12) United States Patent
Mikkola et al.

(10) Patent No.: US 6,682,642 B2
(45) Date of Patent: Jan. 27, 2004

(54) SEED REPAIR AND ELECTROPLATING BATH

(75) Inventors: Robert A. Mikkola, Grafton, MA (US); Jeffrey M. Calvert, Acton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 119 days.

(21) Appl. No.: 09/976,422

(22) Filed: Oct. 12, 2001

(65) Prior Publication Data

US 2002/0043468 A1 Apr. 18, 2002

Related U.S. Application Data

(60) Provisional application No. 60/240,365, filed on Oct. 13, 2000.

(51) Int. Cl.⁷ .............................. C25D 3/38; C23C 18/38
(52) U.S. Cl. ......................................... 205/296; 106/1.26
(58) Field of Search ............................. 106/1.25, 1.26; 205/238, 261, 296, 297

(56) References Cited

U.S. PATENT DOCUMENTS

| 3,864,222 A | | 2/1975 | Wilson et al. ................ 204/43 |
| 4,038,161 A | * | 7/1977 | Eckles et al. ................ 205/298 |
| 4,376,685 A | * | 3/1983 | Watson ....................... 205/298 |
| 5,068,013 A | | 11/1991 | Bernards et al. ............. 204/24 |
| 6,024,857 A | | 2/2000 | Reid ........................... 205/123 |
| 6,444,110 B2 | * | 9/2002 | Barstad et al. .............. 205/123 |
| 2002/0043467 A1 | * | 4/2002 | Morrissey et al. .......... 205/157 |

FOREIGN PATENT DOCUMENTS

| DE | 1 915 653 | 10/1970 |
| WO | WO 98/27585 | 6/1998 |

OTHER PUBLICATIONS

Patent Abstracts of Japan, vol. 1999, No. 12, Oct. 29, 1999 & JP 11 193488 A (Nippon Hyomen Kagaku KK), Jul. 21, 1999 –abstract.
Patent Abstracts of Japan, vol. 008, No. 122 (C–227), Jun. 8, 1984 & JP 59 035693 A (Seiko Denshi Kogyo KK), Feb. 27, 1984 –abstract.
Patent Abstracts of Japan, vol. 007, No. 143 (C–172), Jun. 22, 1983 & JP 58 055587 A (Daini Seikosha KK), Apr. 1, 1983 –abstract.
Patent Abstracts of Japan, vol. 1995, No. 09, Oct. 31, 1995 & JP 07 157890 A (Okuno Chem Ind Co Ltd.), Jun. 20, 1995 –abstract.

* cited by examiner

*Primary Examiner*—Edna Wong
(74) *Attorney, Agent, or Firm*—S. Matthew Cairns

(57) ABSTRACT

Disclosed are compositions useful for repair and electroplating of seed layers. Also disclosed are methods of repairing and electroplating such seed layers.

22 Claims, No Drawings

SEED REPAIR AND ELECTROPLATING BATH

This application claims the benefit of U.S. Provisional Application No. 60/240,365 filing date Oct. 13, 2000

BACKGROUND OF THE INVENTION

The present invention relates generally to the field of electroplating. In particular, the present invention relates to the field of copper electroplating on a seed layer.

The trend toward smaller microelectronic devices, such as those with sub-micron geometries, has resulted in devices with multiple metallization layers to handle the higher densities. One common metal used for forming metal lines, also referred to as wiring, on a semiconductor wafer is aluminum. Aluminum has the advantage of being relatively inexpensive, having low resistivity, and being relatively easy to etch. Aluminum has also been used to form interconnections in vias to connect the different metal layers. However, as the size of via/contact holes shrinks to the sub-micron region, a step coverage problem appears which in turn can cause reliability problems when using aluminum to form the interconnections between the different metal layers. Such poor step coverage results in high current density and enhances electromigration.

One approach to providing improved interconnection paths in the vias is to form completely filled plugs by using metals such as tungsten while using aluminum for the metal layers. However, tungsten processes are expensive and complicated, tungsten has high resistivity, and tungsten plugs are susceptible to voids and form poor interfaces with the wiring layers.

Copper has been proposed as a replacement material for interconnect metallizations. Copper has the advantages of improved electrical properties as compared to tungsten and better electromigration property and lower resistivity than aluminum. The drawbacks to copper are that it is more difficult to etch as compared to aluminum and tungsten and it has a tendency to migrate into (and diffuse rapidly through a) dielectric layer such as silicon dioxide. To prevent such migration, a barrier layer, such as titanium nitride, tantalum, tantalum nitride, tantalum silicon nitride, tungsten nitride, and the like, must be used prior to the depositing of a copper layer.

Typical techniques for applying a copper layer, such as electrochemical deposition, are only suitable for applying copper to an electrically conductive layer. Thus, an underlying conductive seed layer, typically a metal seed layer such as copper, is generally applied to the substrate prior to electrochemically depositing copper. Such seed layers may be applied by a variety of methods, such as physical vapor deposition ("PVD"; which includes sputtering, evaporation, or deposition from ionized metal plasma of hollow cathode magnetron sources) and chemical vapor deposition ("CVD", which includes deposition from metal or organometallic precursors comprising one of more metal atoms in combination with inorganic or organic ligands such as halides, pseudohalides, carbonyls, nitrites, alkyls, olefins, allyls, arenes, phosphines, amines, and the like). Typically, seed layers are thin in comparison to other metal layers, such as from 50 to 1500 angstroms thick. Such metal seed layers, particularly copper seed layers, may suffer from problems such as metal oxide both on the surface of the seed layer and in the bulk of the layer as well as significant variations in thickness or discontinuities in the layer.

Oxide on a metal seed layer, particularly a copper seed layer, interferes with subsequent copper deposition. Such oxide forms from exposure of the metal seed layer to sources of oxygen, such as air. Typically, the longer such seed layer is exposed to oxygen, the greater the amount of oxide formation. Where a copper seed layer is thin, the copper oxide may exist as copper oxide throughout the layer. In other areas of electroplating, such as in electronics finishing, copper oxide layers are typically removed by acidic etching baths. These baths dissolve the oxide layer, leaving a copper metal surface. Such etching processes are not generally applicable to copper seed layers because of the thinness of the seed layer. As the oxide is removed from the seed layer surface there is the danger that the entire seed layer may be removed in places, creating discontinuities in the seed layer.

U.S. Pat. No. 5,824,599 (Schacham-Diamand et al.) discloses a method of preventing oxide formation on the surface of a copper seed layer by conformally blanket depositing under vacuum a catalytic copper layer over a barrier layer on a wafer and then, without breaking the vacuum, depositing a protective aluminum layer over the catalytic copper layer. The wafer is then subjected to an electroless copper deposition solution which removes the protective aluminum layer exposing the underlying catalytic copper layer and then electrolessly deposits copper thereon. However, such method requires the use of a second metal, aluminum, which adds to the cost of the process and the presence of any unremoved protective layer prior to the electroless deposition of the copper may cause problems in the final product, such as an increase in resistivity. In addition, the dissolved aluminum may build up in the electroless copper bath, which could also cause problems in the final product.

The step coverage by the PVD copper seed layer at apertures less than 0.18 $\mu$m on advanced interconnects becomes a limiting factor for void free copper fill. Decreased step coverage on the lower sidewalls of vias and trenches leads to a thin and discontinuous copper seed layer. Discontinuities or voids are areas in the seed layer where coverage of the metal, such as copper, is incomplete or lacking. Such discontinuities can arise from insufficient blanket deposition of the metal layer, such as depositing the metal in a line of sight fashion. Subsequent copper electroplating fill with traditional electrolytes and additives results in the formation of bottom voids, associated with incomplete fill over the discontinuous copper seed. In order for a complete metal layer to be electrochemically deposited on such a seed layer, the discontinuities must be filled in prior to or during the deposition of the final metal layer, or else voids in the final metal layer may occur.

PCT patent application number WO 99/47731 (Chen) discloses a method of providing a seed layer by first vapor depositing an ultra-thin seed layer followed by electrochemically enhancing the ultra-thin seed layer to form a final seed layer. According to this patent application, a two step process provides a seed layer having reduced discontinuities. The copper seed layer is enhanced by using an alkaline electrolytic bath. One using this method to enhance a seed layer would have to rinse and neutralize the seed layer before using conventional acidic electrolytic plating baths. In addition, a manufacturer using such alkaline enhancement method in combination with an acid electroplating bath would have to double the number of plating heads on the plating tool or throughput would decrease.

In general, the electrochemical metallization process for advanced interconnects uses a highly conductive sulfuric acid electrolyte (170 g/L $H_2SO_4$), cupric sulfate (17 g/L), and chloride ions (50–70 mg/L). An organic additive package is used to assist in the development of bottom-up fill, and to promote a uniform thickness of copper across the wafer. Such additive package typically includes accelerators, suppressors and levelers and may optionally include surfactants, defoamers, or ductilizers for the purpose of modifying the properties of the plating bath or the resultant metal deposits. A balance must be struck between the use of such accelerators, suppressors, levelers, and other additives to achieve the desired level of copper fill of apertures without void formation. If such balance is not achieved, then the plating across the wafer may occur much faster than plating within the aperture, resulting in void formation within the apertures. Many factors may affect the stability and consumption of each of the additive components in the plating bath. Thus, if one of these components is consumed at a faster rate than the others, the balance of the additives may be adversely affected.

Also, exposure of marginally thin copper seed to the highly acidic electrolyte results in partial or complete removal of the thin conductive copper oxide layer on the seed layer, which can expose the underlying agglomerated copper seed layer ("copper islands"). Copper electroplating with traditional chemistry formulations is not adequate for repair of the thin-agglomerated copper seed, and the final fill result contains bottom voids.

Thus, there is a continuing need for methods of repairing seed layers having discontinuities. There is also a continuing need for electroplating baths that provide good fill of recessed features, that do not require the use of additional metals, that enhance the lateral growth of seed layers to reduce or remove discontinuities, and that are compatible with commercial metal deposition processes.

SUMMARY OF THE INVENTION

It has been surprisingly found that the elimination of the bottom voids within apertures during electroplating on marginally thin copper seed can be accomplished by modification of the electrolyte composition and organic additive package. Such organic additive package modification is the use of certain branched suppressor compounds. It has been further surprisingly found that such branched suppressor compounds form complexes with copper that exhibit a higher degree of surface than conventional straight chain suppressor compounds.

In one aspect, the present invention provides an electroplating bath including a source of metal ions, an electrolyte and one or more branched suppressor compounds.

In a second aspect, the present invention provides a method of depositing a metal layer on a substrate including the steps of: a) contacting a substrate with an electroplating bath including a source of metal ions, an electrolyte and one or more branched suppressor compounds; and b) subjecting the electroplating bath to a current density sufficient to deposit the metal layer.

In a third aspect, the present invention provides a method of manufacturing an electronic device including the steps of: a) contacting an electronic device with an electroplating bath including a source of metal ions, an electrolyte and one or more branched suppressor compounds; and b) subjecting the electroplating bath to a current density sufficient to deposit the metal layer on the electronic device.

The invention also includes articles of manufacture, including electronic packaging devices such as printed circuit boards, multichip modules, semiconductor integrated circuits and the like that contain a copper deposit produced from a plating solution of the invention.

In a fourth aspect, the present invention provides an article of manufacture including an electronic device substrate containing one or more apertures each aperture containing an electrolytic copper deposit obtained from an electroplating composition that includes at least one soluble copper salt, an electrolyte and one or more branched suppressor compounds.

In a fifth aspect, the present invention provides a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated by a copper electroplating composition including at least one soluble copper salt, an electrolyte and one or more branched suppressor compounds.

In a sixth aspect, the present invention provides a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated by the composition described above.

In a seventh aspect, the present invention provides a method of repairing a seed layer including the steps of: a) contacting a substrate including a seed layer having oxidation or discontinuities; b) contacting the substrate with an electroplating bath including a source of metal ions, an electrolyte and one or more branched suppressor compounds; and c) subjecting the electroplating bath to a current density sufficient to deposit sufficient metal to provide a substantially uniform seed layer.

In an eighth aspect, the present invention provides a method of suppressing the plating rate of a metal from an electroplating bath including the step of adding one or more branched polymeric compounds containing one or more heteroatoms selected from oxygen or nitrogen and having a molecular weight of greater than or equal to 10,000 to a metal electroplating bath.

DETAILED DESCRIPTION OF THE INVENTION

As used throughout the specification, the following abbreviations shall have the following meanings, unless the context clearly indicates otherwise: nm=nanometers; g/L= grams per liter; ASF=amperes per square foot; M=molar; $\mu$m=micron=micrometer; and ppm=parts per million.

As used throughout the specification, "feature" refers to the geometries on a substrate, such as, but not limited to, trenches and vias. "Apertures" refer to recessed features, such as vias and trenches. The term "small features" refers to features that are one micron or smaller in size. "Very small features" refers to features that are one-half micron or smaller in size. Likewise, "small apertures" refer to apertures that are one micron or smaller in size and "very small apertures" refer to apertures that are one-half micron or smaller in size. As used throughout this specification, the term "plating" refers to metal electroplating, unless the context clearly indicates otherwise. "Deposition" and "plating" are used interchangeably throughout this specification. The term "accelerator" refers to a compound that enhances the plating rate. The term "suppressor" refers to a compound that suppresses the plating rate. "Halide" refers to fluoride, chloride, bromide, and iodide. "Pseudohalide" refers to anionic ligands such as thiocyanide ($NCS^-$), azide ($N_3^-$), and the like.

All percentages and ratios are by weight unless otherwise indicated. All ranges are inclusive and combinable.

Electroplating solutions of the present invention generally include at least one soluble copper salt, an electrolyte, and a branched suppressor compound. The electroplating solutions of the present invention may optionally contain one or more additives, such as halides, accelerators or brighteners, other suppressors, levelers, grain refiners, wetting agents, surfactants, defoamers, ductilizers, and the like.

A variety of copper salts may be employed in the subject electroplating solutions, including for example copper sulfates, copper acetates, copper fluoroborate, and cupric nitrates. Copper sulfate pentahydrate is a particularly preferred copper salt. A copper salt may be suitably present in a relatively wide concentration range in the electroplating compositions of the invention. Preferably, a copper salt will be employed at a concentration of from about 1 to about 300 g/L of plating solution, more preferably at a concentration of from about 10 to about 225 g/L, still more preferably at a concentration of from about 25 to about 175 g/L. It is preferred that the copper ion is present in the electroplating bath in an amount of from about 15 to about 50 g/L, and more preferably about 30 to about 45 g/L. The copper plating bath may also contain amounts of other alloying elements, such as, but not limited to, tin, zinc, indium, antimony, and the like. Thus, the copper electroplating baths useful in the present invention may deposit copper or copper alloy.

Plating baths useful in the present invention employ an electrolyte, preferably an acidic electrolyte. When the electrolyte is acidic, the acid may be inorganic or organic. Suitable inorganic acids include, but are not limited to, sulfuric acid, phosphoric acid, nitric acid, hydrogen halide acids, sulfamic acid, fluoroboric acid and the like. Suitable organic acids include, but are not limited to, alkylsulfonic acids such as methanesulfonic acid, aryl sulfonic acids such as phenylsulfonic acid and tolylsulfonic acid, carboxylic acids such as formic acid, acetic acid and propionic acid, halogenated acids such as trifluoromethylsulfonic acid and haloacetic acid, and the like. Particularly suitable organic acids include ($C_1$–$C_{10}$)alkylsulfonic acids. Preferred acids include sulfuric acid, nitric acid, methanesulfonic acid, phenylsulfonic acid, mixtures of sulfuric acid and methanesulfonic acid, mixtures of methanesulfonic acid and phenylsulfonic acid, and mixtures of sulfuric acid, methanesulfonic acid and phenylsulfonic acid.

It will be appreciated by those skilled in the art that a combination of two or more acids may be used. Particularly suitable combinations of acids include one or more inorganic acids with one or more organic acids or a mixture of two or more organic acids. Typically, the two or more acids may be present in any ratio. For example, when two acids are used, they may be present in any ratio from 99:1 to 1:99. Preferably, the two acids are present in a ratio from 90:10 to 10:90, more preferably from 80:20 to 20:80, still more preferably from 75:25 to 25:75, and even more preferably from 60:40 to 40:60.

The total amount of added acid used in the present electroplating baths may be from about 0 to about 100 g/L, and preferably from 0 to 50 g/L, although higher amounts of acid may be used for certain applications, such as up to 225 g/L or even 300 g/L. It will be appreciated by those skilled in the art that by using a metal sulfate as the metal ion source, an acidic electrolyte can be obtained without any added acid.

For certain applications, such as in the plating of wafers having very small apertures, it is preferred that the total amount of added acid be low. By "low acid" is meant that the total amount of added acid in the electrolyte is less than about 0.4 M, preferably less than about 0.3 M, and more preferably less than about 0.2 M. It is further preferred that the electrolyte is free of added acid.

The electrolyte may optionally contain one or more halides, and preferably does contain at least one halide. Chloride and bromide are preferred halides, with chloride being more preferred. A wide range of halide ion concentrations (if a halide ion is employed) may be suitably utilized, e.g. from about 0 (where no halide ion employed) to 100 ppm of halide ion in the plating solution, preferably from about 10 to about 75 ppm, and more preferably from about 25 to about 75 ppm. A particularly useful range of chloride ion is from about 10 to about 35 ppm.

The suppressor compounds useful in the present invention are branched, preferably highly branched, polymeric compounds. By "branched" is meant that the suppressor polymers are not linear. Such branched suppressors exhibit a higher degree of surface coverage than the corresponding non-branched compounds. The present branched suppressors maximize the degree of suppression on a flat field as well as the upper portions of the interior of the aperture during the initial several seconds of electroplating. The branched suppressors of the present invention do not include minimally branched or non-branched suppressor compounds, such as those disclosed in U.S. Pat. No. 5,328,589. The compounds disclosed in this patent contain only simple alkyl (methyl) branching from the polymer backbone. The ether linkages are disclosed only in the polymer backbone.

The present suppressor compounds contain a number of functional groups capable of forming complexes with copper, such as one or more heteroatoms selected from oxygen or nitrogen. It is preferred that at least some of these functional groups are in the branches of the polymer, i.e. that some of such functional groups are pendant to the polymer backbone. Suitable functional groups include ether linkages, such as polyether linkages, and amino linkages. For example, suitable branched suppressors include those having the formula

where R is a polymeric backbone or pendant group; each X, Y, X' and Y' is independently hydrogen, alkyl preferably methyl, ethyl or propyl, aryl such as phenyl; aralkyl such as benzyl; and preferably one or more of X, Y, X' and Y' is hydrogen; n is an integer between 5 and 100,000; and m is an integer from 2 to 1000. Preferably, n is greater than 12,000. It is preferred that the number of such functional groups, m, is at least 5, more preferably at least 10, and even more preferably at least 20. Particularly suitable branched suppressors are those wherein m is 2 to 700, more particularly 5 to 500, and even more particularly 10 to 250.

Suitable branched suppressor compounds include, for example, highly branched linear polymers, dendrimers and star polymers, having one or more ether or amino linkages. Such highly branched linear polymers, dendrimers and star polymers are well known in the literature. Suitable branched suppressors may be prepared by surface modifying conventional highly branched linear polymers, dendrimers and star polymers to incorporate the desired ether and/or amino functionality. In the alternative, suitable ether or amino-containing monomers may be used to prepare the highly branched linear polymers, dendrimers and star polymers. Suitable ether containing monomers, include, for example, poly(alkylene oxide) monomers, poly(alkylene oxide) acrylates and poly(alkylene oxide) methacrylates. Other suitable monomers are those containing $CH_2$—$CH((CH_2)_n$—$CH_3)$—O—, —$C((CH_2)_n$—$CH_3)_2$—O—, —$C((CH_2)_n$—$CH_3)_2$—O—$(CH_2)_m$—$C((CH_2)_p$—$CH_3)_2$—O—, and the like, where n, m and p are integers independently selected from 1 to 1000, preferably 2 to 800, more preferably 5 to 500 and even more preferably 8 to 300.

Such branched suppressors are typically water soluble or water dispersible. In general, the present branched suppressors have a molecular weight in the range of about 10,000 or greater, preferably 15,000 or greater, more preferably 20,000 or greater, still more preferably 30,000 or greater, and even more preferably 50,000 or greater. There is no practical upper limit to the branched suppressor molecular weight, as long as the polymer is water soluble or dispersible. Thus, branched suppressors having molecular weights of 70,000, 80,000, 90,000, 1,000,000 and higher may be used.

It is preferred that the branched polymeric suppressors of the present invention have branches (or chains pendant from the polymer backbone) that have a molecular weight of at least 20, preferably at least 35, more preferably at least 50, still more preferably at least 100, and even more preferably at least 200. Thus, typical branches or side chains have at least 2 carbon atoms and preferably at least 3 carbon atoms. Such branches or side chains may be aliphatic, substituted aliphatic, aromatic, and substituted aromatic and may also include one or more heteroatoms such as oxygen or nitrogen. "Substituted aliphatic" and "substituted aromatic" refer to replacing one or more of the hydrogens on the aliphatic or aromatic group with one or more other substituents such as halogen, cyano, hydroxyl, $(C_1$–$C_{20})$alkoxy, phenoxy, and the like.

Thus, the present invention provides a method of suppressing the plating rate of a metal from an electroplating bath including the step of adding one or more branched polymeric compounds containing one or more heteroatoms selected from oxygen or nitrogen and having a molecular weight of greater than or equal to 10,000 to a metal electroplating bath.

The amount of such suppressors present in the electroplating baths is in the range of from about 0.1 to about 1000 ppm. Preferably, the suppressor compounds are present in an amount of from about 0.5 to about 800 ppm, and more preferably from about 1 to about 500 ppm. It will be appreciated by those skilled in the art that one or more conventional (i.e. linear) suppressors may be used in combination with the branched suppressors of the present invention. Such combination may have advantages under certain circumstances where a balance of suppression characteristics is desired.

A wide variety of brighteners (or accelerators), including known brightener agents, may be employed in the copper electroplating compositions of the invention. Typical brighteners contain one or more sulfur atoms, and typically without any nitrogen atoms and a molecular weight of about 1000 or less. Brightener compounds that have sulfide and/or sulfonic acid groups are generally preferred, particularly compounds that comprise a group of the formula R'—S—R—$SO_3X$, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (i.e. —S—R—$SO_3X$ or substituent of a larger compound). Typically alkyl groups will have from one to about 16 carbons, more typically one to about 8 or 12 carbons. Heteroalkyl groups will have one or more hetero (N, O or S) atoms in the chain, and preferably have from 1 to about 16 carbons, more typically 1 to about 8 or 12 carbons. Carbocyclic aryl groups are typical aryl groups, such as phenyl and naphthyl. Heteroaromatic groups also will be suitable aryl groups, and typically contain 1 to about 3 N, O or S atoms and 1–3 separate or fused rings and include e.g. coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, benzothiazol, and the like. Heteroalicyclic groups typically will have 1 to 3 N, O or S atoms and from 1 to 3 separate or fused rings and include e.g. tetrahydrofuranyl, thienyl, tetrahydropyranyl, piperdinyl, morpholino, pyrrolindinyl, and the like. Substituents of substituted alkyl, heteroalkyl, aryl or heteroalicyclic groups include e.g. $C_{1-8}$ alkoxy; $C_{1-8}$ alkyl, halogen, particularly F, Cl and Br; cyano, nitro, and the like.

More specifically, useful brighteners include those of the following formulae:

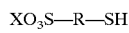

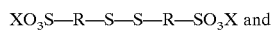

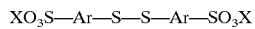

where in the above formulae R is an optionally substituted alkyl group, and preferably is an alkyl group having, from 1 to 6 carbon atoms, more preferably is an alkyl group having from 1 to 4 carbon atoms; Ar is an optionally substituted aryl group such as optionally substituted phenyl or naphthyl; and X is a suitable counter ion such as sodium or potassium.

Some specific suitable brighteners include e.g. n,n-dimethyl-dithiocarbamic acid-(3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1-propane sulfonic acid (potassium salt); bissulfopropyl disulfide; 3-(benzthiazolyl-s-thio)propyl sulfonic acid (sodium salt); pyridinium propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Additional suitable brighteners are also described in U.S. Pat. Nos. 3,770,598, 4,374,709, 4,376,685, 4,555,315, and 4,673,469, all incorporated herein by reference. Particularly preferred brighteners for use in the plating compositions of the invention are n,n-dimethyl-dithiocarbamic acid-(3-sulfopropyl)ester and bis-sodium-sulfonopropyl-disulfide.

The amount of such accelerators present in the electroplating baths is in the range of from about 0.1 to about 1000 ppm. Preferably, the accelerator compounds are present in an amount of from about 0.5 to about 300 ppm, more preferably from about 1 to about 100 ppm, and still more preferably from about 2 to about 50 ppm.

Surfactants may optionally be added to the electroplating baths. Such surfactants are typically added to copper electroplating solutions in concentrations ranging from about 1 to 10,000 ppm based on the weight of the bath, more preferably about 5 to 10,000 ppm. Particularly suitable surfactants for plating compositions of the invention are commercially available polyethylene glycol copolymers, including polyethylene glycol copolymers. Such polymers are available from e.g. BASF (sold by BASF under TETRONIC and PLURONIC tradenames), and copolymers from Chemax.

Levelers may optionally be added to the present electroplating baths. It is preferred that one or more leveler components is used in the present electroplating baths. Such levelers may be used in amounts of from about 0.01 to about 50 ppm. Examples of suitable leveling agents are described and set forth in U.S. Pat. Nos. 3,770,598, 4,374,709, 4,376,685, 4,555,315 and 4,673,459. In general, useful leveling agents include those that contain a substituted amino group such as compounds having R—N—R', where each R and R' is independently a substituted or unsubstituted alkyl group or a substituted or unsubstituted aryl group. Typically the alkyl groups have from 1 to 6 carbon atoms, more typically from 1 to 4 carbon atoms. Suitable aryl groups include substituted or unsubstituted phenyl or naphthyl. The substituents of the substituted alkyl and aryl groups may be, for example, alkyl, halo and alkoxy.

More specifically, suitable leveling agents include, but are not limited to, 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; N-heteroaromatic rings containing polymers; quaternized, acrylic, polymeric amines; polyvinyl carbamates; pyrrolidone; and imidazole. A particularly preferred leveler is 1-(2-hydroxyethyl)-2-imidazolidinethione.

Particularly suitable electroplating baths of the present invention include 0 to 100 g/L, preferably 0 to 50 g/L, of sulfuric acid, 15 to 50 g/L copper ions and preferably 30 to 45 g/L of copper ions, 10 to 35 ppm of chloride ion, and 1 to 500 ppm of branched suppressor compound. More particularly suitable baths further include 0 to 13 ppm of accelerator compound and 0 to 10 ppm of leveling agent.

The present copper electroplating compositions are suitably used in similar manner as prior copper electroplating baths. Plating baths of the invention are preferably employed at below room temperature, such as about 15° C., at room temperature or above room temperature, such as up to 65° C. and greater. Preferably, the plating baths are operated in the range of 20 to 25° C. The plating composition is preferably agitated during use such as by air sparger, work piece agitation, impingement or other suitable method. Plating is preferably conducted at a current ranging from 1 to 40 ASF depending upon substrate characteristics. Plating time may range from about 2 minutes to 1 hour or more, depending on the difficulty of the work piece.

The present electroplating baths not only provide good fill of small apertures, e.g. 0.18 μm and smaller, but also provide in-situ repair of the seed layer. Thus, the present invention provides a method of repairing a seed layer including the steps of: a) contacting a substrate including a seed layer having oxidation or discontinuities; b) contacting the substrate with an electroplating bath including a source of metal ions, an electrolyte and one or more branched suppressor compounds; and c) subjecting the electroplating bath to a current density sufficient to deposit sufficient metal to provide a substantially uniform seed layer.

Exposure of marginally thin copper seed to highly acidic conventional electrolyte results in removal of the thin conductive copper oxide layer on the seed layer, exposing the underlying agglomerated copper seed layer (copper islands). Preferably, the present electroplating bath compositions are selected such that they are less acidic than conventional baths. Such less acidic baths have reduced copper oxide etching and copper seed layer corrosion than conventional plating baths. While not intending to be bound by theory, it is believed that the suppression provided by the present branched suppressors enhances the selective nucleation of the thin copper seed along the lower sidewalls of the apertures during the initial seconds of electroplating. The present compositions have higher copper nucleation rates within apertures than conventional electroplating baths.

Once the seed layer has been rendered continuous by the present method, the electroplating fill sequence proceeds by the normal bottom-up fill sequence. It will be appreciated by those skilled in the art that the use of a hot entry step in the plating waveform will further ensure the reduction or elimination of void formation on the thin copper seed layer. The choice of the particular waveform will depend upon the a number of factors known to those skilled in the art.

A wide variety of substrates may be plated with the compositions of the invention, as discussed above. The compositions of the invention are particularly useful to plate difficult work pieces, such as circuit board substrates with small diameter, high aspect ratio microvias and other apertures. The plating compositions of the invention also will be particularly useful for plating integrated circuit devices, such as formed semiconductor devices and the like. The compositions of the invention are particularly suitable for plating high aspect ratio microvias and trenches, such as those having aspect rations of 4:1 or greater.

As discussed above, aspect ratios of at least 4:1, having diameters of about 200 nm or smaller have been effectively copper plated with no defects (e.g. no voids or inclusions by ion beam examination) using plating solutions of the invention. Apertures with diameters below 150 nm, or even below about 100 nm, and aspect ratios of 5:1, 6:1, 7:1, 10:1 or greater, and even up to about 15:1 or greater can be effectively plated (e.g. no voids or inclusions by ion beam examination) using plating solutions of the invention.

Thus, the present invention provides a method of depositing a metal layer on a substrate including the steps of: a) contacting a substrate with an electroplating bath including a source of metal ions, an electrolyte and one or more branched suppressor compounds and b) subjecting the electroplating bath to a current density sufficient to deposit the metal layer on the substrate.

A wide variety of substrates may be plated with copper according to the present invention. Particularly suitable are substrates used in the manufacture of electronic devices, such as wafers used in the manufacture of integrated circuits, printed wiring board inner layers and outer layers, flexible circuits and the like. It is preferred that the substrate is a wafer.

The present invention provides a method of manufacturing an electronic device including the steps of: a) contacting an electronic device with an electroplating bath including a source of metal ions, an electrolyte and one or more branched suppressor compounds; and b) subjecting the electroplating bath to a current density sufficient to deposit the metal layer on the electronic device.

Accordingly, the present invention also provides an article of manufacture including an electronic device substrate containing one or more apertures each having walls, the aperture walls having thereon an electrolytic copper deposit obtained from an electroplating composition that includes at least one soluble copper salt, an electrolyte and one or more branched suppressor compounds.

A semiconductor wafer is generally plated with excess copper. During the process of manufacturing an integrated circuit, a semiconductor wafer is often polished to remove the excess unwanted materials on the surface of the wafer. Polishing generally takes the form of chemical-mechanical planarization ("CMP") wherein a chemically active slurry is used in conjunction with a polishing pad. Thus, once a semiconductor wafer is plated according to the present invention, the wafer is preferably subjected to CMP. A CMP procedure can be conducted in accordance with the invention as follows.

The wafer is mounted in a wafer carrier which urges the wafer against the surface of a moving polishing pad. The polishing pad can be a conventional smooth polishing pad or a grooved polishing pad. Examples of a grooved polishing pad are described in U.S. Pat. Nos. 5,177,908; 5,020,283; 5,297,364; 5,216,843; 5,329,734; 5,435,772; 5,394,655; 5,650,039; 5,489,233; 5,578,362; 5,900,164; 5,609,719; 5,628,862; 5,769,699; 5,690,540; 5,778,481; 5,645,469; 5,725,420; 5,842,910; 5,873,772; 5,921,855; 5,888,121; 5,984,769; and European Patent 806267. The polishing pad can be located on a conventional platen can rotate the polishing pad. The polishing pad can be held on the platen by a holding means such as, but not limited to, an adhesive, such as, two faced tape having adhesive on both sides.

A polishing solution or slurry is fed onto the polishing pad. The wafer carrier can be at a different positions on the polishing pad. The wafer can be held in position by any suitable holding means such as, but is not limited to, a wafer holder, vacuum or liquid tensioning such as, but not limited to a fluid such as, but not limited to water. If the holding means is by vacuum then there is preferably a hollow shaft which is connected to the wafer carrier. Additionally, the hollow shaft could be used to regulate gas pressure, such as, but not limited to air or an inert gas or use a vacuum to initially hold the wafer. The gas or vacuum would flow from the hollow shaft to the carrier. The gas can urge the wafer against the polishing pad for the desired contour. The vacuum can initially hold the wafer into position in the wafer carrier. Once the wafer is located on top of the polishing pad the vacuum can be disengaged and the gas pressure can be engaged to thrust the wafer against the polishing pad. The excess or unwanted copper is then removed. The platen and wafer carrier can be independently rotatable. Therefore, it is possible to rotate the wafer in the same direction as the polishing pad at the same or different speed or rotate the wafer in the opposite direction as the polishing pad.

Thus, the present invention provides a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated by a copper electroplating composition including at least one soluble copper salt, an electrolyte and one or more branched suppressor compounds.

Also provided is a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated by the composition described above.

While the present invention has been described with respect to copper electroplating baths, it will be appreciated by those skilled in the art that the present mixed acid electrolyte may be used with a variety of plating baths, such as copper alloy, tin, tin alloy, nickel, nickel-alloy, and the like.

What is claimed is:

1. An electroplating bath comprising a source of copper ions, an electrolyte and one or more branched polyether polymers as suppressor compounds wherein the branches of the polyether polymers comprise ether linkages and wherein the branched polyether polymers are chosen from dendrimers, star polymers and branched linear polymers comprising at least 5 branches.

2. The electroplating bath of claim 1 wherein the one or more branched polyether polymers has a molecular weight of 10,000 or greater.

3. The electroplating bath of claim 2, wherein the molecular weight is 50,000 or greater.

4. The electroplating bath of claim 1 wherein the electrolyte is acidic.

5. The electroplating bath of claim 1 wherein the electrolyte is free of added acid.

6. The electroplating bath of claim 1 wherein the copper ions are present in an amount of from 15 to 50 g/L.

7. The electroplating bath of claim 1 wherein the electrolyte further comprises a halide.

8. The electroplating bath of claim 7 wherein the halide is present in an amount of from 10 to 35 ppm.

9. A method of repairing a seed layer comprising the steps of: a) contacting a substrate comprising a seed layer having oxidation or discontinuities with the electroplating bath of claim 1; and b) subjecting the electroplating bath to a current density sufficient to deposit sufficient copper to provide a substantially uniform seed layer.

10. A method of depositing a copper layer on a substrate comprising the steps of: a) contacting a substrate with an electroplating bath comprising a source of copper ions, an electrolyte and one or more branched polyether polymers as suppressor compounds wherein the branches of the polyether polymers comprise ether linkages and wherein the branched polyether polymers are chosen from dendrimers, star polymers and branched linear polymers comprising at least 5 branches and b) subjecting the electroplating bath to a current density sufficient to deposit the copper layer.

11. The method of claim 10 wherein the one or more branched polyether polymers have a molecular weight of 10,000 or greater.

12. The method of claim 11, wherein the molecular weight is 50,000 or greater.

13. The method of claim 10 wherein the electrolyte is acidic.

14. The method of claim 10 wherein the electrolyte is free of added acid.

15. The method of claim 10 wherein the copper ions are present in an amount of from 30 to 45 g/L.

16. The method of claim 10 wherein the electrolyte further comprises a halide.

17. The method of claim 10 wherein the halide is present in an amount of from 10 to 35 ppm.

18. A method of manufacturing an electronic device comprising the steps of: a) contacting an electronic device with an electroplating bath comprising a source of copper ions, an electrolyte and one or more branched polyether polymers suppressor compounds wherein the branches of the polyether polymers as comprise ether linkages and wherein the branched polyether polymers are chosen from dendrimers, star polymers and branched linear polymers comprising at least 5 branches; and b) subjecting the electroplating bath to a current density sufficient to deposit a copper layer on the electronic device.

19. The method of claim 18 wherein the electrolyte is acidic.

20. The method of claim 18 wherein the electrolyte is free of added acid.

21. The method of claim 18 wherein the copper ions are present in an amount of from 30 to 45 g/L.

22. The method of claim 18 wherein the electrolyte further comprises a halide.

* * * * *